United States Patent
Cho et al.

(10) Patent No.: US 7,876,107 B2
(45) Date of Patent: Jan. 25, 2011

(54) OBSTACLE DETECTION SYSTEM AND OBSTACLE DETECTION METHOD THEREOF

(75) Inventors: Seung Won Cho, Ansan-shi (KR); Kwang Seok Jeong, ShiHeong-shi (KR)

(73) Assignee: Auto Tech Co., Ltd., Chiyoda-ku, Tokyo ( * ) Notice: Subject to any disclaimer, the term of this patent is extended or adjusted under 35 U.S.C. 154(b) by 212 days.

(21) Appl. No.: 12/337,065

(22) Filed: Dec. 17, 2008

(65) Prior Publication Data
US 2009/0153151 A1    Jun. 18, 2009

(30) Foreign Application Priority Data
Dec. 17, 2007   (KR) .................. 10-2007-0132448

(51) Int. Cl.
*G01R 27/26* (2006.01)
(52) U.S. Cl. .................. 324/681; 324/683; 340/545.4
(58) Field of Classification Search .......... 324/681, 324/683; 340/545.4
See application file for complete search history.

(56) References Cited

U.S. PATENT DOCUMENTS 5,245,295 A * 9/1993 Hata et al. .................. 324/683
7,532,151 B2 * 5/2009 Touge et al. .................. 342/27

FOREIGN PATENT DOCUMENTS

KR   10-2004-0041697   5/2004
WO   03-034080        4/2003

* cited by examiner

*Primary Examiner*—Vincent Q Nguyen
(74) *Attorney, Agent, or Firm*—Banner & Witcoff, Ltd.

(57) ABSTRACT

An obstacle detection system includes a static capacitance detection module including a sensor strip for detecting a static capacitance, an RF oscillator connected to the sensor strip, a phase lock loop section for maintaining the oscillation frequency of the RF oscillator to a selected value and a first MCU for controlling the operation of the phase lock loop section, a control module including a second MCU for remotely controlling the first MCU of the static capacitance detection module and a transmission line for connecting the static capacitance detection module and the control module and transmitting the information acquired by the first MCU so as to be transmitted to the control module, a control signal to be transmitted from the second MCU to the first MCU and drive power of the static capacitance detection module.

14 Claims, 6 Drawing Sheets

PRIOR ART

OBSTACLE DETECTION SYSTEM AND OBSTACLE DETECTION METHOD THEREOF

CROSS REFERENCE TO RELATED APPLICATION

This patent application is based upon and claims the benefit of priority from prior Korean Patent Application No. 10-2007-132448, filed Dec. 17, 2007, the entire contents of which are incorporated herein by reference.

BACKGROUND OF THE INVENTION

1. Field of the Invention

The present invention relates to an obstacle detection system for detecting an obstacle by utilizing a change in the static capacitance and a method thereof. More particularly, the present invention relates to an obstacle detection system and a detection method thereof that can provide an improved detection accuracy and an improved reliability by utilizing a phase locked loop.

2. Description of the Related Art

The doors of a vehicle are to be opened and closed directly by hand in the past. However, the number of vehicles having doors that can be opened and closed remotely by operating a button has been and is increasing.

In accordance with such a trend, there is an increasing demand for obstacle detecting systems that can interrupt the operation of closing a door or a window of a vehicle immediately when an obstacle is detected and drive the door or the window, whichever appropriate, in the opposite direction in order to prevent the obstacle, which may be a human hand or human body, from being pinched, if partly, in the door or the window, whichever appropriate.

Obstacle detection systems are roughly classified into the contact type and the non-contact type. Obstacle detection systems of the contact type detect a change in the electric load or the air pressure that arises when an obstacle contacts a door or a window and determine the presence or absence of an obstacle. On the other hand, obstacle detection systems of the non-contact type detect the presence or absence of an obstacle before a door or a window touches an obstacle. Obstacle detecting systems of the contact type that utilize a static capacitance is in the main stream as disclosed in Korean Patent unexamined Publication No. 10-2004-0041697.

FIG. 1 of the accompanying drawings schematically illustrates the configuration of a known obstacle detection system designed to detect a change in the static capacitance. The illustrated static capacitance detection system includes a static capacitance detection module 12 for detecting a static capacitance, a control module 18 for determining the presence or absence of an obstacle, utilizing the signal output from the static capacitance detection module 12 and a transmission line 20 for transmitting the output signal of the static capacitance detection module 12 to the control module 18.

The static capacitance detection module 12 by turn includes one or more sensor strips 14 arranged along the periphery of a door or a window and one or more static capacitance detection circuits 16, which or each of which is connected to an end of the sensor strip or each of the sensor strips 14 to detect the static capacitance of the sensor strip or each of the sensor strips 14, whichever appropriate.

A sensor strip 14 is formed by inserting a thin strip-shaped conductor into a highly flexible insulator typically made of rubber and the conductor operates as an electrode of the corresponding capacitor. Thus, the static capacitance of the sensor strip 14 varies depending on if there is an obstacle in the vicinity thereof or not.

While two sensor strips 14 are shown in FIG. 1, the number of sensor strips 14 is by no means limited to two and they may be arranged anywhere around a door or a window. While the sensor strips 14 are linear in FIG. 1, they may be bent or warped depending on the positions where they are arranged.

As schematically illustrated in FIG. 2 of the accompanying drawings, the static capacitance detection circuit 16 or each of the static capacitance detection circuits 16 is connected to a sensor strip 14 and includes an RF oscillator 42 for generating a high frequency signal of a variable RF oscillation frequency $f_{RF}$, a local oscillator 40 for generating a signal of a local oscillation frequency $f_{LO}$, a mixer 44 for mixing the output signal of the RF oscillator 42 and the output signal of the local oscillator 40 to produce a signal of a frequency equal to the sum of the above frequencies, or $f_{LO}+f_{RF}$, or the difference of the above frequencies, or $f_{LO}-f_{RL}$, a low pass filter 46 for passing only a low frequency signal out of the output signal of the mixer 44 and an amplifier 48 for amplifying the output of the low pass filter 46 among others.

The control module 18 includes a micro control unit (MCU) and, upon receiving the output signal of the static capacitance detection circuit 16, takes a role of determining if the signal is cut of an allowable range or not, comparing the output signal with a reference value. If the output signal of the static capacitance detection circuit 16 is determined to be out of the allowable range as a result of referring to the reference value, it transmits a control signal for automatically opening or closing a door or a window to a corresponding opening/closing module 30 in order to interrupt the motion of the door or the window, whichever appropriate, or drive it in the opposite direction.

The local oscillation frequency $f_{LO}$ of the local oscillator 40 and the RF oscillation frequency $f_{RF}$ of the RF oscillator 42 are determined at the time of designing the circuit. In other words, the output signal of the static capacitance detection circuit 16 shows a constant frequency in the normal condition where no obstacle is detected.

However, as a human hand or a human body approaches the door or the window, if partly, the static capacitance of the sensor strip 14 changes and hence the oscillation frequency of the RF oscillator 42 connected to the sensor strip 14 is changed.

As the oscillation frequency of the RF oscillator 41 is changed and the frequency of the output signal of the static capacitance detection circuit 16 goes out of the allowable frequency range, the control module 18 determines that there is an obstacle in the vicinity of the door or the window.

For example, if the RF oscillation frequency $f_{RF}$ of the RF oscillator 42 is 920 MHz and the local oscillation frequency $f_{LO}$ of the local oscillator 40 is 925 MHz, the frequency of the output signal of the static capacitance detection circuit 16 is held to 5 MHz in a state where there is no obstacle.

If the RF oscillation frequency $f_{RF}$ of the RF oscillator 42 is changed to 916 MHz, for instance, in this state, the frequency of the output signal of the static capacitance detection circuit 16 is changed to 9 MHz and hence the control module 18 recognizes that there is an obstacle in the vicinity of the door or the window from the change.

Obstacle detection systems of the above-described type are accompanied by a number of problems as listed below.

Firstly, while the oscillation frequency of the RF oscillator 42 and that of the local oscillator 40 are determined by way of a frequency tuning operation in the process of manufacturing the static capacitance detection circuit 16 but the accuracy of such a tuning operation depends on the experience of the operator and involves trial and error so that such an operation constitutes a significant limiting factor relative to productivity.

More specifically, a frequency tuning operation is performed by adjusting the inductance L and the capacitance C of the wiring to an oscillator, of which the inductance L is adjusted by changing the length of a copper foil (pattern) and the capacitance C is adjusted by changing the area of the copper foil. Thus, a frequency tuning operation is an operation for an operator of cutting a copper foil (pattern) to a predetermined length.

This will be described further by referring to FIG. 3 of the accompanying drawings that shows the wiring pattern of the printed circuit board (PCB) of a static capacitance detection circuit 16. The operation of tuning the local oscillation frequency $f_{LO}$ of the local oscillator 40 proceeds as the operator cuts the wire in the local oscillator tuning section 60 near the lower end of the PCB, checking the oscillation frequency $f_{LO}$.

On the other hand, the operation of tuning the RF oscillation frequency $f_{RF}$ of the RF oscillator 42 proceeds as the operator adjusts the length of the wire in the RF oscillator tuning section 62, checking the oscillation frequency $f_{RF}$.

Secondly, the reliability of a static capacitance detection circuit 12 can fall with time. More specifically, if the oscillation frequencies $f_{RF}$ and $f_{LO}$ are properly tuned in the circuit manufacturing process, they change gradually with time because the PCB and the sensor strip 14 are degraded with time and/or for some other reasons. Then, operation errors can take place to the static capacitance detection circuit 12.

If an operation error takes place for such reasons, it is highly difficult for the user to tune the oscillation frequencies and hence he or she will have to buy a new one.

Thirdly, there is a problem that there exist cyclic dead points in the operating area of a static capacitance detection circuit where any approaching obstacle cannot be detected.

According to the results of some experiments, dead points appear at regular intervals of about 14 cm when an RF oscillator of 900 MHz is employed and at regular intervals of about 28 cm when an RF oscillator of 450 MHz is employed. While the exact cause of appearance of such dead points is not known yet, it is presumed that the sensor strip 14 may operate like an antenna for the RF oscillator and hence the dead points may be related to $\lambda/2$ of the oscillation signal.

Therefore, the problem that an obstacle is not detected can be prevented to some extent by lowering the oscillation frequency to increase the intervals of dead points or by raising the oscillation frequency to minimize the intervals of dead points. For example, the intervals of dead points can be increased to about 280 cm by lowering the oscillation frequency to 40 MHz so that a smaller sensor strip can be employed. On the other hand, the intervals of dead points can be reduced to about 1.4 cm by raising the oscillation frequency to 9 GHz so that an obstacle having a width of 1.4 cm can be satisfactorily detected.

However, when the oscillation frequency is lowered, the oscillation frequency changes only to a small extent when an obstacle approaches the sensor strip so that the static capacitance detection circuit 12 shows a poor sensitivity. Then, it may sometime not properly detect an obstacle. When, on the other hand, the oscillation frequency is raised too much, the manufacturing cost will rise and design difficulties will become enormous among other problems.

SUMMARY OF THE INVENTION

In view of the above-identified problems of the conventional art, the first object of the present invention is to make it possible to manufacture a static capacitance detection circuit to be used in an obstacle detection system without requiring a complex frequency tuning step to thereby achieve a high productivity for manufacturing static capacitance detection circuits.

The second object of the present invention is to improve the reliability of a static capacitance detection circuit by allowing the user to adjust the oscillation frequencies of the static capacitance detection circuit with ease even when the product is degraded and the oscillation frequency is changed due to the degradation. The third object of the present invention is to solve the problem of poor sensitivity due to an appearance of dead points.

In the first aspect of the present invention, the above objects are achieved by providing an obstacle detection system including: a static capacitance detection module including a sensor strip for detecting a static capacitance, an RF oscillator connected to the sensor strip, a phase lock loop section for maintaining the oscillation frequency of the RF oscillator to a selected value and a first MCU for controlling the operation of the phase lock loop section; a control module including a second MCU for remotely controlling the first MCU of the static capacitance detection module; and a transmission line for connecting the static capacitance detection module and the control module and transmitting the information acquired by the first MCU so as to be transmitted to the control module, a control signal to be transmitted from the second MCU to the first MCU and drive power of the static capacitance detection module.

An obstacle detection system in the first aspect of the invention as defined above is preferably characterized by including a frequency changing section connected at an end thereof to the first MCU and at the other end thereof to the RF oscillator so as to cause the RF oscillator to oscillate at a plurality of frequencies sequentially and repeatedly under the control of the first MCU.

In another aspect of the present invention, there is provided an obstacle detection system including: a static capacitance detection module including a sensor strip for detecting a static capacitance, a plurality of RF oscillators connected in parallel to the sensor strip so as to oscillate with different respective frequencies, a phase lock loop section for maintaining the oscillation frequencies of the plurality of RF oscillators to selected respective values and a first MCU for controlling the operation of the phase lock loop section so as to cause the plurality of RF oscillators to oscillate sequentially in a defined order; and a transmission line for connecting the static capacitance detection module and the control module and transmitting the information acquired by the first MCU, a control signal to be transmitted from the second MCU to the first MCU and drive power of the static capacitance detection module.

A static capacitance detection circuit to be used in an obstacle detection system according to the present invention as defined above can be manufactured without requiring any complex frequency tuning process so that such an obstacle detection system can realize a remarkably improved productivity. In other words, such an obstacle detection system provides an advantage that the oscillation frequencies of the RF oscillators can be tuned by controlling the phase lock loop after manufacturing the static capacitance detection circuit.

Additionally, an obstacle detection system according to the present invention as defined above can be formed by using only RF oscillators, eliminating the use of a local oscillator and a mixer so that the overall configuration of the product is simplified and the manufacturing cost can be reduced. Still additionally, since the phase lock loop can constantly maintain the oscillation frequencies of the RF oscillators to predetermined respective values so that the product is prevented from giving rise to operation errors and the reliability of the product is remarkably improved. Additionally, the reliability of product is further improved because it can accurately detect an obstacle if dead points are produced in the sensor strip of the obstacle detection system.

DETAILED DESCRIPTION OF THE INVENTION

Now, the present invention will be described in greater detail by referring to the accompanying drawings that illustrate preferred embodiments of the invention.

First Embodiment

Figure 1:
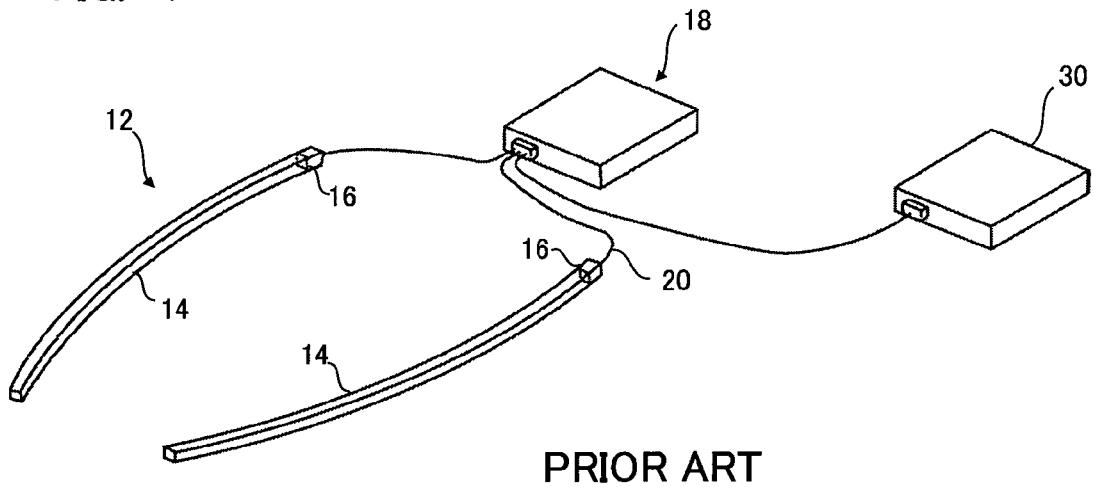
FIG. 1 is a schematic illustration of a known obstacle detection system utilizing a change in a static capacitance.
Figure 2:
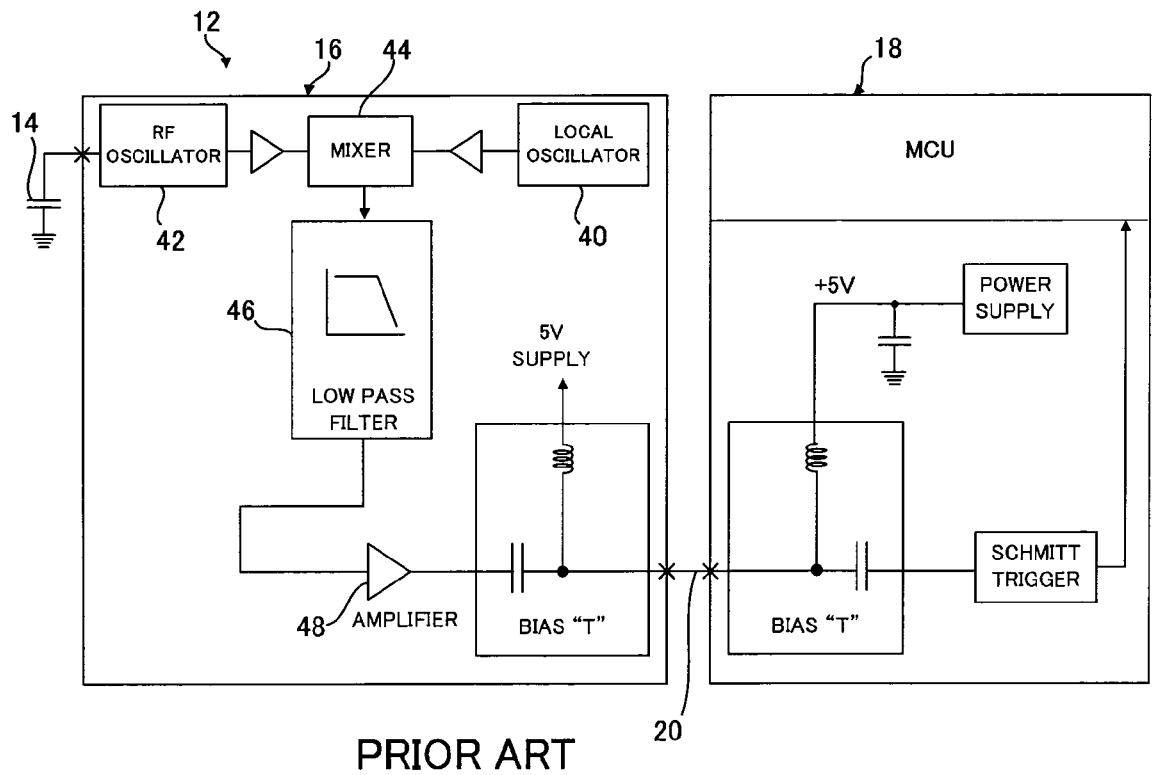
FIG. 2 is an exemplar circuit block diagram of the obstacle detection system of FIG. 1.
Figure 3:
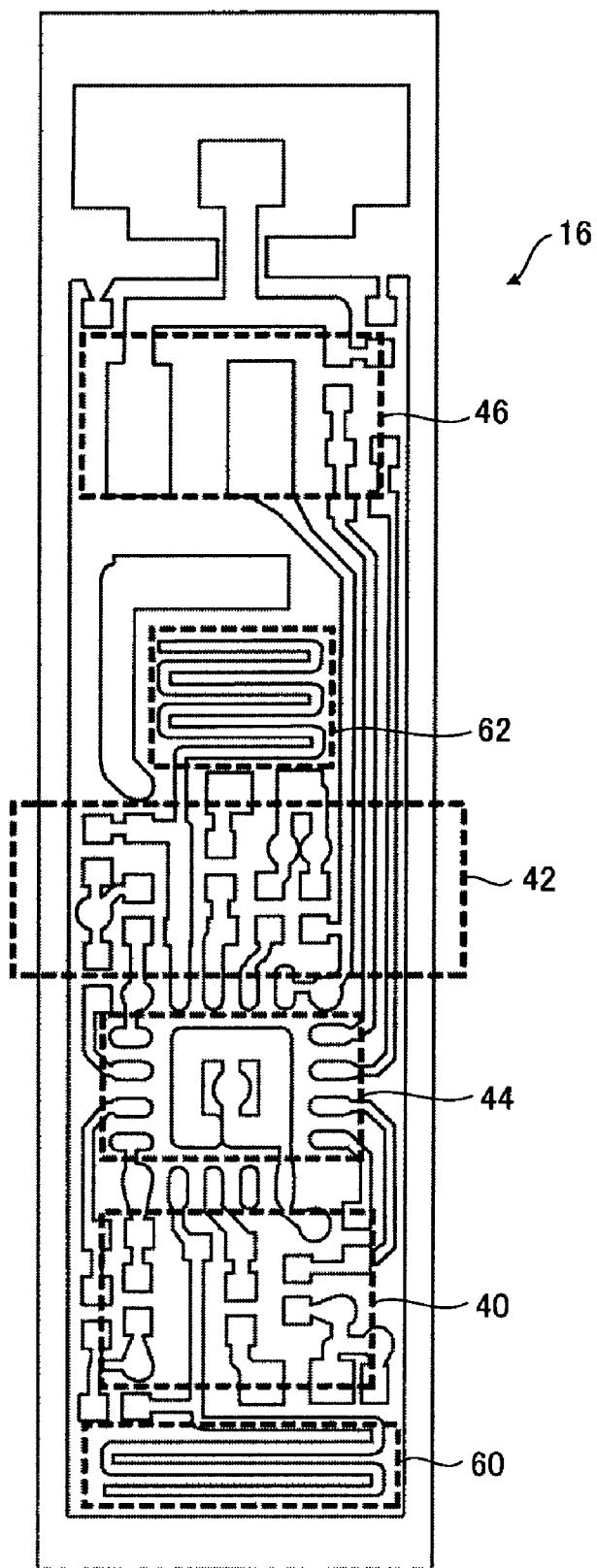
FIG. 3 is a schematic illustration of the wiring pattern of the PCB of the detection circuit to be inserted into an end part of the sensor strip of the system of FIG. 1.
Figure 4:
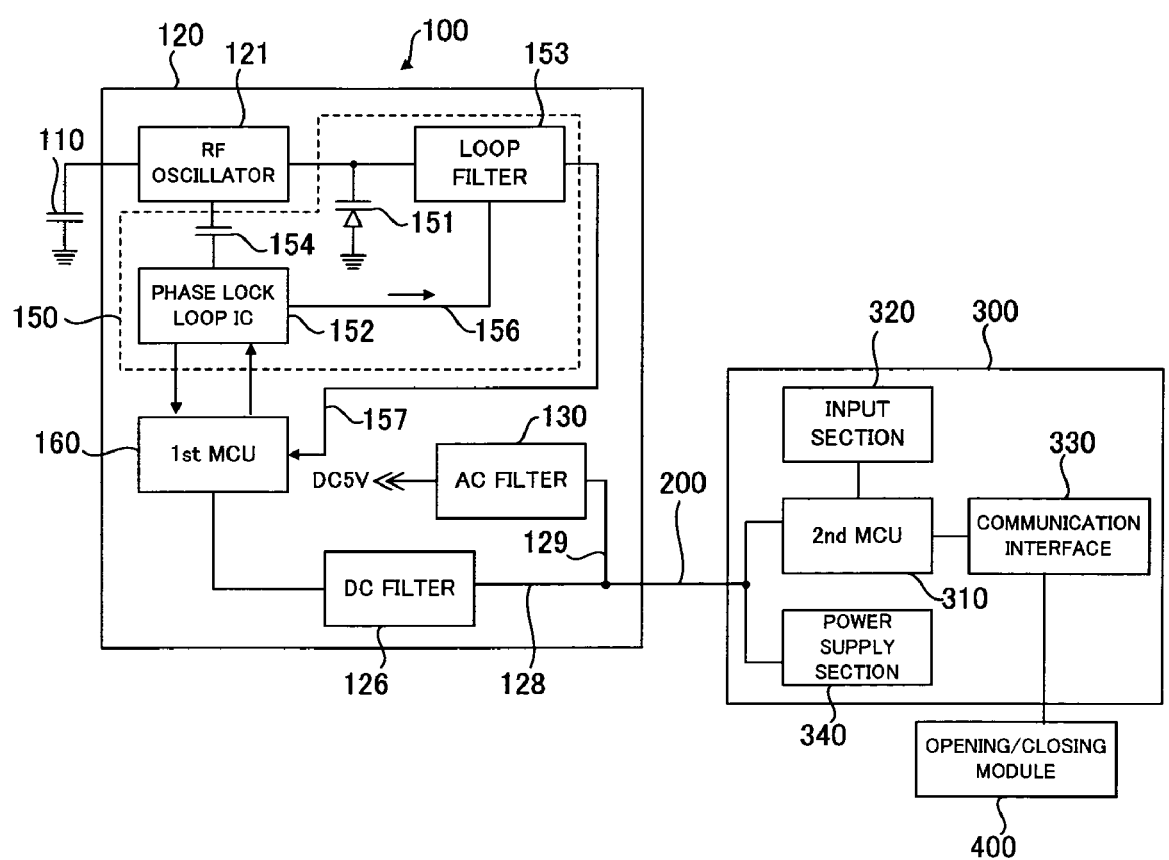
FIG. 4 is a circuit block diagram of the obstacle detection system according to a first embodiment of the present invention.

FIG. 4 is a circuit block diagram of the static capacitance detection system according to the first embodiment of the present invention. The illustrated static capacitance detection system includes a static capacitance detection module 100, a control module 300 and a transmission line 200 for transmitting signals between the static capacitance detection module 100 and the control module 300.

The static capacitance detection module 100 by turn includes a sensor strip 110 for detecting a static capacitance and a static capacitance detection circuit 120 that detects a change in the static capacitance of the sensor strip 110 and outputs a signal corresponding to the change.

The sensor strip 110 is formed by inserting a thin strip-shaped n conductor into a highly flexible insulator typically made of rubber like known popular sensor strips, while the static capacitance detection circuit 120 is formed on a small printed circuit board (PCB) and contained in an end part of the sensor strip 110.

The static capacitance detection circuit 120 includes an RF oscillator 121 connected to the sensor strip 110, a phase lock loop section 150 for maintaining the RF oscillation frequency $f_{RF}$ of the RF oscillator 121 to a constant level and a first MCU 160 for detecting the state of a specific part of the phase lock loop section 150 in terms of voltage and determines the presence or absence of an obstacle by itself or transfers the detected voltage to the control module 300.

The phase lock loop section 150 includes a variable capacitance diode 151 having an end thereof connected to the RF oscillator 121, a phase lock loop IC 152, a frequency adjusting signal line 156 connecting the phase lock loop IC 152 and the variable capacitance diode 151 and a detection capacitor 154.

The variable capacitance diode 151 has a property of changing its static capacitance according to the voltage applied to it. One of its ends is connected to the frequency adjusting signal line 156 while its other end is grounded. Therefore, it actively adjusts the RF oscillation frequency $f_{RF}$ of the RF oscillator 121 and, if the RF oscillation frequency needs to be changed, it is only necessary to change the frequency adjusting voltage being applied to the variable capacitance diode 151.

The RF oscillator 121 and the phase lock loop IC 152 are connected in parallel relative to the variable capacitance diode 151.

The phase lock loop IC 152 continuously checks the oscillation frequency of the RF oscillator 121 by way of the detection capacitor 154. On the other hand, the phase lock loop IC 152 takes a role of supplying a frequency adjusting voltage to the variable capacitance diode 151 by way of the frequency adjusting signal line 156 to constantly maintain the oscillation frequency of the RF oscillator 121 to a predetermined level.

The frequency adjusting signal line 156 may be connected to a loop filter 153 for converting the power being supplied to it to DC power.

The obstacle detection system according to the embodiment of the present invention is characterized in that it constantly maintains the oscillation frequency of the RF oscillator 121 to a predetermined level by utilizing the phase lock loop IC 152 in an operation mode of closing a gate or a door.

The oscillation frequency of the RF oscillator 121 changes as an obstacle approaches the sensor strip 110 to change the static capacitance. Then, the phase lock loop IC 152 appropriately changes the frequency adjusting voltage being applied to the variable capacitance diode 151 in order to constantly maintain the oscillation frequency.

Thus, maintaining the frequency adjusting voltage to a predetermined reference value means that here is not obstacle and the oscillation frequency of the RF oscillator 121 is maintained to a reference level. Therefore, the presence or absence of an obstacle can be determined by referring to the presence or absence of a change in the frequency adjusting voltage.

The first MCU 160 controls the operation of driving the phase lock loop TC 152 on the one hand and defects a change in the frequency adjusting voltage by way of the voltage detection line 157 connected to the loop filter 153 on the other hand.

Thus, the first MCU 16 can directly determine the presence or absence of an obstacle according to the detected voltage value. Alternatively, it may transmits the detected voltage value to the second MCU 310 of the control module 300 so that the second MCU 31C may determine the presence of absence of an obstacle.

The control module 300 includes the second MCU 310, an input section 320, a communication interface 330, a power supply section 340 and so on.

The second MCU 310 detects the output signal of the static capacitance detection circuit 120 and determines the presence or absence of an obstacle on the one hand. It also detects the presence or absence of an operation of opening/closing module 400 for automatically opening or closing a door or a window of a vehicle to take a role of transmitting a predetermined control signal to the first MCU 160 of the static capacitance detection circuit 120 on the other hand.

The input section 320 is a section by way of which the user inputs a control signal, a reset signal or some other signal. The communication interface 330 is a section for communicating with an external opening/closing module.

The power supply section 340 is a section for supplying drive power to the control module 300 and the static capacitance detection module 100. It typically supplies DC power of 5V.

The transmission line 200 connecting the static capacitance detection module 100 and the control module 300 is branched into a control signal line 128 and a power supply line 129 in the inside of the static capacitance detection circuit 120.

The control signal line 128 is for transmitting a rectangular wave or sine wave control signal supplied from the control module 300. It is provided at an intermediate position thereof with a DC filter 126 for blocking the DC power supply signal supplied from the control module 300.

The power supply line 129 is for supplying DC power supplied from the power supply section 340 of the control module 300 further to the RF oscillator 121, the phase lock loop section 150, the first MCU 160 and so on. The power supply line 129 is provided with an AC filter 130 for blocking a rectangular wave or sine wave control signal.

Thus, DC power being supplied from the power supply section 340 of the control module 300 (e.g., DC 5V), the rectangular wave or sine wave control signal output from the second MCU 310 and the information signal representing the presence or absence of an obstacle being transmitted from the first MCU 160 to the second MCU 310 or the information signal for the frequency adjusting voltage coexist on the transmission line 200 connecting the static capacitance detection module 100 and the control module 300.

As pointed out above, the presence or absence of an obstacle can be determined either by the first MCU 160 or by the second MCU 310. When it is determined that an obstacle exists by some means, the second MCU 310 controls the opening/closing module 400 to interrupt the operation of closing the gate or the door, or drive the gate or the door in the opposite direction.

Now, the obstacle detection method of the obstacle detection system of the first embodiment of the present invention will be described below by referring to FIG. 4.

First of all, a reference frequency to be used for the RF oscillator 121 and a reference value for the frequency adjusting voltage to be output for the purpose of maintaining the reference frequency of the RF oscillator 121 need to be defined and set in the phase lock loop 152 in advance. Additionally, software that can determine the extent to which the frequency adjusting voltage is to be applied in order to bring back the oscillation frequency of the RF oscillator 121 to the reference frequency when it is changed as an obstacle approaches it or hardware for realizing such an algorithm needs to be installed in the obstacle detection system.

However, alternatively, such a reference frequency and such a reference value may be defined and set in the first MCU 160 and the phase lock loop 152 may be controlled by the first MCU 160. This statement also applies to the other embodiments, which will be described hereinafter.

Once a reference frequency and a reference value for the frequency adjusting voltage are defined and set, the control module 300 drives the opening/closing module 400 to operate and the obstacle detection system is shifted from a standby status into an operation mode in response to a user's action of pushing the opening/closing button.

When the obstacle detection system is in a standby status and one of the doors or the windows of the vehicle is open, the RF oscillator 121 may operate at an arbitrary frequency or its operation may have been interrupted.

To shift the system from a standby status into an operation mode, the second MCU 310 of the control module 300 typically transmits a rectangular wave or sine wave control signal to the first MCU 160 by way of the transmission line 200.

As an obstacle approaches to change the static capacitance of the sensor strip 110 in an operation mode, the RF oscillation frequency $f_{RF}$ deviates from the reference frequency. In such a case, the phase lock loop IC 152 outputs a frequency adjusting voltage that differs from the reference value in order to maintain the reference frequency. Thus, it makes the oscillation frequency $f_{RF}$ stick to the reference frequency by adjusting the static capacitance of the variable capacitance diode 151 in this way.

At this time, the first MCU 160 monitors the frequency adjusting voltage output from the phase lock loop IC 152 by way of the voltage detection line 157 and compares the detected voltage with the reference value to determine if the detected voltage is out of the allowable range or not. It also transmits the detected voltage value to the second MCU 310.

If it is determined by the first MCU 160 or the second MCU 310 that the frequency adjusting voltage is out of the allowable ranger the second MCU 310 of the control module 300 sends out a control signal to interrupt the operation of the opening/closing module 400 or drive the door or the window in the opposite direction.

If there is not any obstacle in the course of the operation of closing the gate or the door (in an operation mode), the frequency adjusting voltage output from the phase lock loop IC 152 is held to the reference value and the gate closing operation proceeds properly.

Second Embodiment

The first embodiment of obstacle detection system and obstacle detection method is designed to constantly maintain the oscillation frequency of the RF oscillator to a predetermined level by utilizing a phase lock loop. However, the first embodiment is not free from dead points that appear in the sensor strip at regular intervals like known obstacle detection systems.

Figure 5:
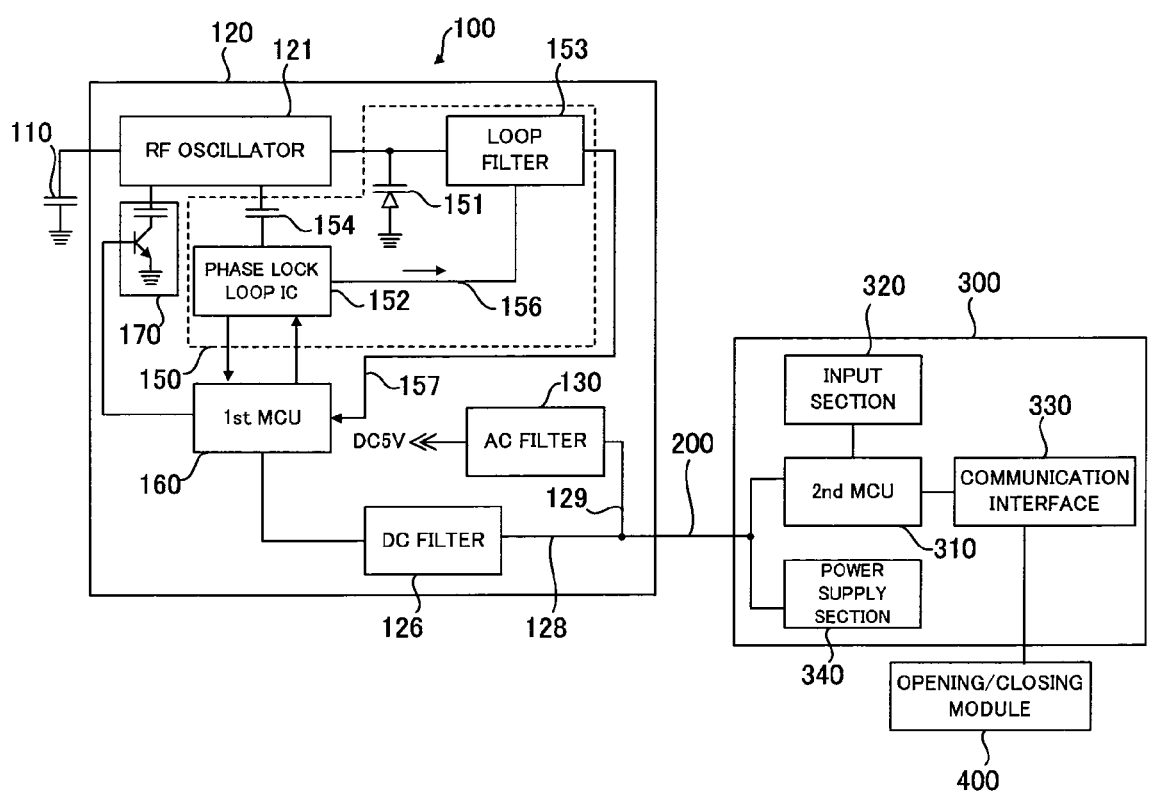
FIG. 5 is a circuit block diagram of the obstacle detection system according to a second embodiment of the present invention.

This second embodiment of optical detection system is designed to dissolve the poor sensitivity problem relative to dead points and characterized in that the RF oscillator 121 that now includes a frequency changing section 17C as shown in FIG. 5 is caused to oscillate at a plurality of frequencies sequentially and repeatedly.

For the purpose of simplicity, the components of the second embodiment that are same as those of the first embodiment will not he described in the following description of the second embodiment.

The frequency changing section 170 is connected at one of the opposite ends thereof to the first MCU 160 and at the other end to the RF oscillator 121 and takes a role of changing the oscillation frequency of the RF oscillator 121 according to the control signal output from the first MCU 160.

The frequency changing section 170 may typically be formed by using a capacitor connected to the RF oscillator 121 and a switching element connected in series to the capacitor.

The switching element is preferably a transistor. Then, preferably, the collector (or drain) terminal of the transistor is connected to the capacitor, while the emitter (or source) terminal of the transistor is grounded.

As the control signal of the first MCU 160 is applied to the base (or gate) terminal of the transistor so as to pass the transistor at the regular time intervals that are selected and set in the transistor in this state, the static capacitance of the capacitor periodically changes. Then, the RF oscillator 121 connected to the capacitor oscillates alternately at a first frequency and at a second frequency.

As pointed out above, the intervals of dead points changes when the oscillation frequency changes from a high frequency to a low frequency or vice versa. Thus, the RF oscillator 121 is made to oscillate alternately at a first frequency and at a second frequency that are different from each other, which first frequency and second frequency are appropriately adjusted. Then, the dead points Pf1 that appear when the RF oscillator 121 oscillates at the first frequency can be made not to overlap with the dead points Pf2 that appear when the RF oscillator 121 oscillates at the second frequency.

Therefore, an obstacle cannot be detected when the RF oscillator 121 oscillates at the first frequency in an operation mode and the obstacle approaches any of the dead points Pf2. However, if the oscillation frequency is switched from the first frequency to the second frequency after a short period of time of several to tens of several microseconds, the dead points Pf1 disappear and dead points Pf2 appear at positions different from those of the dead points Pf1 so that the obstacle approaching the dead point Pf1 can be detected during the period in which the RF oscillator 121 oscillates at the second frequency. In this way, the problem of inability of detecting an obstacle due to dead points is dissolved.

Figure 6:
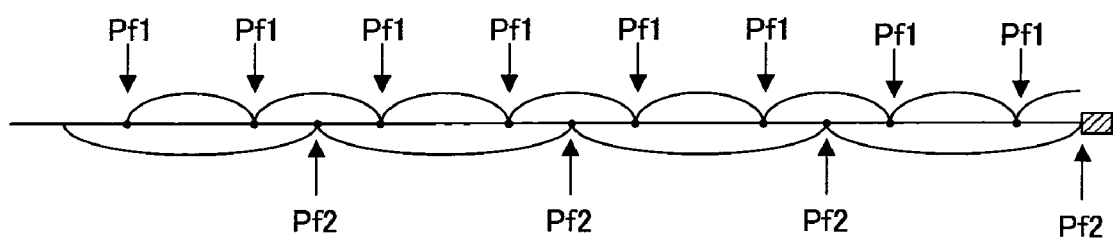
FIG. 6 is a schematic illustration of dead points in a sensor strip, showing the positions thereof.

Now, the operation process of the obstacle detection system of the second embodiment of the present invention will be described in detail by referring to FIGS. 5 and 6.

Firstly, the first frequency and the second frequency are defined as reference frequencies of the RF oscillator 121 and set in the phase lock loop IC 152. Reference oscillation frequencies can be defined and set by way of the first MCU 160 that is remotely controlled by the second MCU 310 of the control module 300.

As the user operates the door opening/closing button in a standby status, the control module 300 drives the opening/closing module 400 to open or close the door or the window connected to it and the obstacle detection system is shifted from a standby status into an operation mode.

The first MCU 160 Is also shifted from a standby status into an operation mode under the control of the second MCU 310 and controls the phase lock loop IC 152 to drive the RF oscillator 121 to oscillate at the first frequency f1 for a predefined time period of T1.

Thereafter, the first MCU 160 transmits a control signal to the frequency changing section 170 to switch the oscillation frequency of the RF oscillator 121 to the second frequency f2 for a predefined time period of T2. At this time, the MCU 160 so controls the phase lock loop TC 152 that the oscillation frequency of the RF oscillator 121 does not get back to the first frequency f1 but maintains the second frequency f2.

Thus, in an operation mode for closing the door or the window, the RF oscillator 121 outputs the first frequency for the time period T1 and subsequently the second frequency for the time period T2 and repeats outputting the first and second frequencies. The time period T1 and the time period T2 are arbitrarily selected time periods, which may be same or different from each other.

If an obstacle approaches the sensor strip 110 in an operation mode, the oscillation frequency of the RF oscillator 121 is changed so that the phase lock loop IC 152 changes the frequency adjusting voltage transmitted to the variable capacitance diode 151 in order to make the oscillation frequency stick to the first frequency or the second frequency.

More specifically, the phase lock loop IC 152 outputs the first frequency adjusting voltage and applies it to the variable capacitance diode 151 during the time period T1 for which the reference oscillation frequency is defined to be equal to the first frequency, while it outputs the second frequency adjusting voltage and applies it to the variable capacitance diode 151 during the time period T2 for which the reference oscillation frequency is defined to be equal to the second frequency.

Thus, when an obstacle approaches, the first MCU 160 compares the first frequency adjusting voltage output from the phase lock loop IC 152 with the corresponding reference value during the first time period T1 and determines if the difference is out of the allowable range or not, whereas the first MCU 160 compares the second frequency adjusting voltage output from the phase lock loop IC 152 with the corresponding reference value during the second time period T2 and determines it the difference is out of the allowable range or not.

Then, if the MCU 160 determines that the difference is out of the allowable range as a result, it transmits the outcome of the determination to the second MCU 310 of the control module 300 in order to interrupt the operation of the opening/closing module 400 or drive the door in the opposite direction.

At this time, the first MCU 160 transmits only the frequency adjusting voltage value detected by way of the voltage detection line 157 to the second MCU 310 so that the second MCU 310 may be able to determine the presence of absence of an obstacle as described earlier for the first embodiment.

If there is not any obstacle detected during the process of closing the door or the window, the opening/closing module 400 operate normally because the first frequency adjusting voltage is constantly held to the corresponding predetermined level for the time period T1 and the second frequency adjusting voltage is constantly held to the corresponding predetermined level for the immediately succeeding time period T2 and so on.

The RF frequency oscillator 121 alternately outputs two oscillation frequencies in the above-described embodiment. However, it may alternatively be so arranged that the RF oscillator outputs three or more frequencies sequentially and repeatedly in order to more reliably detect an obstacle.

Third Embodiment

The first MCU 160 periodically controlled the frequency changing section 170 so as to make the RF oscillator 121 alternately oscillate at the first frequency and at the second frequency in the above-described second embodiment.

Figure 7:
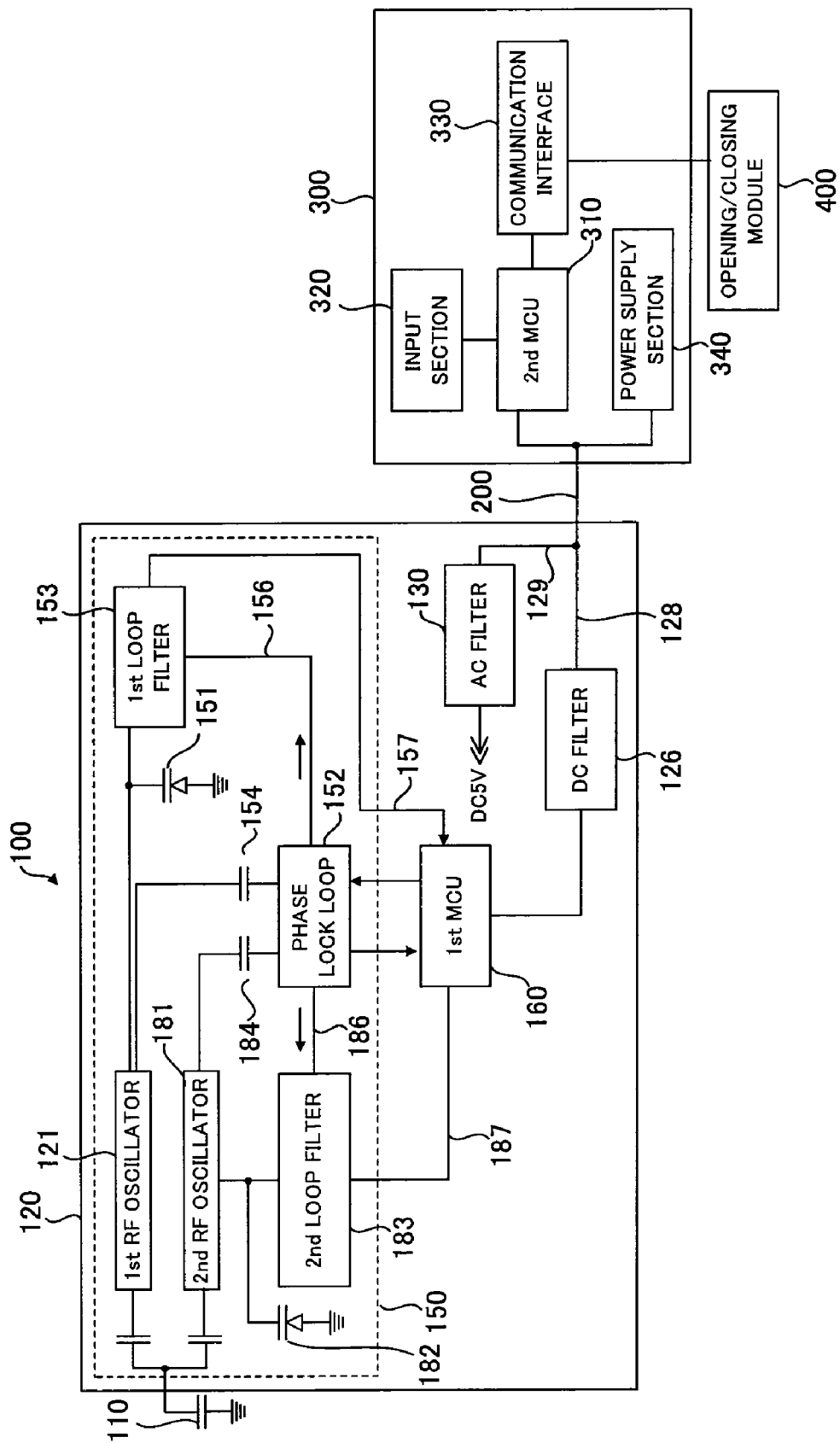
FIG. 7 is a circuit block diagram of the obstacle detection system according to a third embodiment of the present invention.

The obstacle detection system of the third embodiment differs from the second embodiment and is characterized in that it includes two RF oscillators including a first RF oscillator 121 that oscillates at a first frequency and a second RF scanner 181 that oscillates at a second frequency as shown in FIG. 7.

Like the first and second embodiments, the oscillation detection system of the third embodiment includes a static capacitance detection module 100, a control module 300 and a transmission line 200 for transmitting signals between the static capacitance detection module 100 and the control module 300. The static capacitance detection module 100 by turn includes a sensor strip 110 and a static capacitance detection circuit 120 that is connected to an end of the sensor strip 110.

The static capacitance detection circuit 120 forms a phase lock loop section 150 with the first RF oscillator 121, the second RF oscillator 181 and a phase lock loop IC 152. The phase lock loop section 150 is divided into a first phase lock loop where the phase lock loop IC 152 controls the first RF oscillator 121 and a second phase lock loop where the phase lock loop IC 152 controls the second RF oscillator 181.

The first phase lock loop includes a first RF oscillator 121 that is connected to the sensor strip 110, a first variable capacitance diode 151 that is connected to the first RF oscillator 121 to change the oscillation frequency of the first RF oscillator 121 by utilizing the change in the static capacitance connected to the first RF oscillator 121, the phase lock loop IC 152 that monitors the oscillation frequency of the first RF oscillator 121 by utilizing a first detection capacitor 154 and outputs a frequency adjusting voltage, a first frequency adjusting signal line 156 for applying the frequency adjusting voltage output from the phase lock loop IC 152 to the first variable capacitance diode 151 and a first loop filter 153 that is arranged on the first frequency adjusting signal line 156 to convert the frequency adjusting voltage to a DC voltage.

On the other hand, the second phase lock loop includes a second RF oscillator 181 that is connected to the sensor strip 110 in parallel with the first RF oscillator 121, a second variable capacitance diode 182 that is connected to the second RF oscillator 181 to change the oscillation frequency of the second RF oscillator 181 by utilizing the change in the static capacitance connected to the second RF oscillator 181, the phase lock loop IC 152 that monitors the oscillation frequency of the second RF oscillator 181 by utilizing the second detection capacitor 184 and outputs a frequency adjusting voltage, a second frequency adjusting signal line 186 for applying the frequency adjusting voltage output from the phase lock loop IC 152 to the second variable capacitance diode 182 and a second loop filter 183 that is arranged on the second frequency adjusting signal line 186 to convert the frequency adjusting voltage to a DC voltage.

A single phase lock loop IC 152 is commonly shared by the first phase lock loop and the second phase lock loop in the third embodiment of the invention because the two phase lock loops can be independently processed by means of a single phase lock loop IC 152. Therefore, the present invention by no means excludes arranging phase lock loop ICs for respective phase lock loops.

The static capacitance detection circuit 120 includes the first MCU 160, which first MCU 160 controls the phase lock loop IC 152 on the one hand, while it detects the frequency adjusting voltage applied to the first and second variable capacitance diodes 151, 182 respectively by way of the first voltage detection line 157 and the second voltage detection line 187 on the other hand. It determines if an obstacle is approaching the sensor strip 110 or not in this way and transmits the detected voltage value to the second MCU 310.

The obstacle detection method of the obstacle detection system of the third embodiment will be described below.

Firstly, the oscillation frequency of the first RF oscillator 121 and the oscillation frequency of the second RF oscillator 181 are defined and set in the phase lock loop IC 152. At the same time, the operation cycle and the operation time of the first RF oscillator 121 and those of the second RF oscillator 181 are defined and set.

It may be so arranged that the definition and setting process is controlled by the first MCU 160 that is remotely controlled by way of the second MCU 310 of the control module 300. Thus, the first RF oscillator 121 is driven to oscillate at the first frequency for an arbitrarily selected time period T1 and subsequently the second RF oscillator 181 is driven to oscillate at the second frequency for another arbitrarily selected time period T2 and the above operation of driving the first RF oscillator 121 and then the second RF oscillator 181 is repeated.

While the first RF oscillator 121 is driven to oscillate, the first MCU 160 monitors the frequency adjusting voltage being applied to the first variable capacitance diode 151 by way of the first voltage detection line 157 and determines if an obstacle exists or not.

While the second RF oscillator 181 is driven to oscillate, the first MCU 160 monitors the frequency adjusting voltage being applied to the second variable capacitance diode 182 by way of the second voltage detection line 187 and determines if an obstacle exists or not. Since the time period T1 and the time period T2 are arbitrarily selected, they may be equal to each other as pointed out above.

Several to tens of several microseconds may be selected for the time period T1 of the first RF oscillator 121 and also for the time period T2 of the second RF oscillator 181 in the third embodiment. Then, if an obstacle approaching a dead point Pf1 cannot be detected while the first RF oscillator 121 is oscillating, the second RF oscillator 181 is driven to oscillate several to tens of several microseconds thereafter so that the dead point Pf1 disappears and new dead points Pf2 are produced and the obstacle approaching the dead point Pf1 can be detected.

Once the obstacle is detected, the second MCU 310 of the control module 300 controls the opening/closing module 400 to interrupt its operation or drive it in the opposite direction.

While the first RF oscillator 121 and the second RF oscillator 181 are driven to oscillate alternately in the above description, the objects of the present invention can also be achieved by driving the first RF oscillator 121 and the second RF oscillator 181 at the same time.

While two RF oscillators 121, 181 that oscillate respectively at different frequencies are arranged in the static capacitance detection circuit 120 of this embodiment, three or more RF oscillators may alternatively be arranged in order to raise the level of detection accuracy.

Thus, a static capacitance detection circuit to be used in an obstacle detection system as described above can be manufactured without requiring any complex frequency tuning process so that such an obstacle detection system can realize a remarkably improved productivity. In other words, such an obstacle detection system provides an advantage that the oscillation frequencies of the RF oscillators can be tuned by controlling the phase lock loop after manufacturing the static capacitance detection circuit. Additionally, an obstacle detection system according to the present invention as defined above can be formed by using only RF oscillators, eliminating the use of a local oscillator and a mixer so that the overall configuration of the product is simplified and the manufacturing cost can be reduced.

Still additionally, since the phase lock loop can constantly maintain the oscillation frequencies of the RF oscillators to predetermined respective values so that the product is prevented from giving rise to operation errors and the reliability of the product is remarkably improved. Additionally, the reliability of product is further improved because it can accurately detect an obstacle if dead points are produced in the sensor strip of the obstacle detection system.

Additional advantages and modifications will readily occur to those skilled in the art. Therefore, the invention in its broadest aspects is not limited to the specific details and representative embodiments shown and described herein. Accordingly, various modifications may be made without departing from the spirit and scope of the general inventive concept as defined by the appended claims and their equivalents.

What is claimed is:

1. An obstacle detection system comprising:
a static capacitance detection module including a sensor strip for detecting a static capacitance, an RF oscillator connected to the sensor strip, a phase lock loop section for maintaining the oscillation frequency of the RF oscillator to a selected value and a first MCU for controlling the operation of the phase lock loop section;
a control module including a second MCU for remotely controlling the first MCU of the static capacitance detection module; and
a transmission line for connecting the static capacitance detection module and the control module and transmitting the information acquired by the first MCU so as to be transmitted to the control module, a control signal to be transmitted from the second MCU to the first MCU and drive power of the static capacitance detection module.

2. The system according to claim 1, wherein
the phase lock loop section includes:
a variable capacitance diode connected to the RF oscillator;
a phase lack loop IC connected to and controlled by the first MCU;
a frequency adjusting signal line for applying the frequency adjusting voltage output from the phase lock loop IC to the variable capacitance diode; and
frequency detection means arranged between the RF oscillator and the phase lock loop IC to detect the oscillation frequency of the RF oscillator.

3. An obstacle detection method for detecting an obstacle by means of an obstacle detection system according to claim 2, the method comprising:
a step of applying a first frequency adjusting voltage to the variable capacitance diode by means of the phase lock loop IC in order to maintain the oscillation frequency of the RF oscillator to a defined and set value;
a step of detecting the first frequency adjusting voltage by means of the first MCU;
a step of applying a second frequency adjusting voltage different from the first frequency adjusting voltage to the variable capacitance diode by means of the phase lock loop IC in order to restore the RF oscillation frequency when the RF oscillation frequency exceeds a predefined value; and
a step of detecting the second frequency adjusting voltage by means of the first MCU, comparing it with the first frequency adjusting voltage and subsequently transmitting information on the presence or absence of an obstacle and also information on the detected second frequency adjusting voltage to the second MCU of the control module.

4. The system according to claim 1, wherein
the first MCU is connected to voltage detection line for detecting the frequency adjusting voltage output from the phase lock loop IC.

5. The system according to claim 1, further comprising:
a frequency changing section connected at one of the opposite ends thereof to the first MCU and at the other end to the RF oscillator to drive the RF oscillator to oscillate sequentially and repeatedly at a plurality of frequencies under the control of the first MCU.

6. The system according to claim 5, wherein
the frequency changing section includes a plurality of RF oscillators and the oscillation frequencies of the plurality of RF oscillators are so selected that the dead points produced by one of the plurality of RF oscillators due to the sensor strip do not overlap with the dead points produced by any other one of the plurality of RF oscillators due to the sensor strip.

7. The system according to claim 6, wherein
the frequency changing section includes:
a capacitor connected to the RF oscillator; and
a switching element connected at the first terminal thereof to the capacitor, at the second terminal thereof to the ground and at the third terminal thereof to the first MCU.

8. An obstacle detection method for detecting an obstacle by means of an obstacle detection system according to claim 5, the method comprising:
a step of driving the RF oscillator to oscillate at a first frequency;
a step of determining the presence or absence of an obstacle by means of the first MCU or the second MCU, utilizing the electric signal received from the phase lock loop section while the RF oscillator is oscillating at the first frequency;
a step of driving the RF oscillator to oscillate at a second frequency; and
a step of determining the presence or absence of an obstacle by means of the first MCU or the second MCU, utilizing the electric signal received from the phase lock loop section while the RF oscillator is oscillating at the second frequency.

9. The method according to claim 8, wherein
the first frequency and the second frequency are so selected that the dead points produced by one of the oscillation frequency to the sensor strip do not overlap with the dead points produced by the other oscillator frequency due to the sensor strip.

10. An obstacle detection system comprising:
a static capacitance detection module including a sensor strip for detecting a static capacitance, a plurality of RF oscillators connected in parallel to the sensor strip so as to oscillate with different respective frequencies, a phase lock loop section for maintaining the oscillation frequencies of the plurality of RF oscillators to selected respective values and a first MCU for controlling the operation of the phase lock loop section so as to cause the plurality of RF oscillators to oscillate sequentially in a defined order; and
a transmission line for connecting the static capacitance detection module and the control module and transmitting the information acquired by the first MCU, a control signal to be transmitted from the second MCU to the first MCU and drive power of the static capacitance detection module.

11. The system according to claim 10, wherein
the phase lock loop of the static capacitance detection module includes:
a plurality of variable capacitance diodes connected respectively to the plurality of RF oscillators;
a phase lock loop IC controlled by the first MCU to apply frequency adjusting voltages respectively to the plurality of RF oscillators so as to cause the plurality of RF oscillators to output the oscillation frequencies defined and set respectively for them;
a plurality of frequency adjusting signal lines for applying the plurality of frequency adjusting voltages respectively to the plurality of variable capacitance diodes; and
a plurality of frequency detection means arranged respectively between the plurality of RF oscillators and the phase lock loop IC in order to detect the oscillation frequencies of the plurality of RF oscillators.

12. The system according to claim 11, wherein
the oscillation frequencies of the plurality of RF oscillators are so selected that the dead points produced by one of the plurality of RF oscillators due to the sensor strip do not overlap with the dead points produced by any other one of the plurality of RF oscillators due to the sensor strip.

13. An obstacle detection method for detecting an obstacle by means of an obstacle detection system according to claim 10, the method comprising:
   a step of driving the first RF oscillator to oscillate at a first frequency out of the plurality of RF oscillators;
   a step of determining the presence or absence of an obstacle by means of the first MCU or the second MCU, utilizing the electric signal received from the phase lock loop section while the first RF oscillator is oscillating at the first frequency;
   a step of driving the second RF oscillator among the plurality of RF oscillators to oscillate at a second frequency; and
   a step of determining the presence or absence of an obstacle by means of the first MCU or the second MCU, utilizing the electric signal received from the phase lock loop section while the second RF oscillator is oscillating at the second frequency.

14. The method according to claim 13, wherein
the oscillation frequency of the first RF oscillator and the oscillation frequency of the second RF oscillator are so selected that the dead points produced by the first RF oscillator due to the sensor strip do not overlap with the dead points produced by the second RF oscillator due to the sensor strip.

* * * * *